United States Patent
Velilla et al.

(10) Patent No.: US 11,954,995 B2
(45) Date of Patent: Apr. 9, 2024

(54) METHODS AND SYSTEMS FOR ASSET TAGGING BEDDING COMPONENTS AND/OR ACCESSORIES IN A DEFINED ENVIRONMENT

(71) Applicant: DREAMWELL, LTD., Doraville, GA (US)

(72) Inventors: John-David Velilla, Doraville, GA (US); Tyler Marino, Doraville, GA (US); Garrison Mills, Doraville, GA (US)

(73) Assignee: DREAMWELL, LTD., Doraville, GA (US)

( * ) Notice: Subject to any disclaimer, the term of this patent is extended or adjusted under 35 U.S.C. 154(b) by 0 days.

(21) Appl. No.: 17/708,043

(22) Filed: Mar. 30, 2022

(65) Prior Publication Data

US 2022/0327348 A1    Oct. 13, 2022

Related U.S. Application Data

(60) Provisional application No. 63/167,905, filed on Mar. 30, 2021.

(51) Int. Cl.

| | | |
|---|---|---|
| G08B 25/00 | (2006.01) | |
| G08B 23/00 | (2006.01) | |
| G06F 40/284 | (2020.01) | |
| G06F 40/289 | (2020.01) | |
| G06K 7/10 | (2006.01) | |
| G06K 19/077 | (2006.01) | |
| G11C 7/12 | (2006.01) | |
| H04W 4/80 | (2018.01) | |

(52) U.S. Cl.
CPC ........... *G08B 25/003* (2013.01); *G08B 23/00* (2013.01); *G08B 25/00* (2013.01); *G06F 40/284* (2020.01); *G06F 40/289* (2020.01); *G06K 7/10386* (2013.01); *G06K 19/07758* (2013.01); *G11C 7/12* (2013.01); *H04W 4/80* (2018.02)

(58) Field of Classification Search
CPC .. A61B 5/00; A61B 5/022; A61B 5/02; A61B 5/0205; A61B 5/026; G06Q 10/06; G06Q 10/03118; G06Q 10/06316; G06Q 50/24; G01R 1/20; G06F 15/18; G08B 25/00; G08B 25/003; G08B 23/00
See application file for complete search history.

(56) References Cited

U.S. PATENT DOCUMENTS

| | | | |
|---|---|---|---|
| 9,993,166 B1 * | 6/2018 | Johnson | A61B 5/0022 |
| 10,650,358 B1 * | 5/2020 | Edwards | G06Q 30/012 |
| 2010/0019759 A1 * | 1/2010 | Kaji | A61B 5/055 |
| | | | 324/144 |
| 2012/0280040 A1 * | 11/2012 | Carney | G06Q 20/047 |
| | | | 235/383 |
| 2015/0187038 A1 * | 7/2015 | Johnson | G06Q 30/0203 |
| | | | 705/2 |
| 2016/0021116 A1 * | 1/2016 | Maguire | H04L 63/08 |
| | | | 726/4 |
| 2018/0256412 A1 * | 9/2018 | Love | A61F 13/0209 |

OTHER PUBLICATIONS

NPL Search (May 30, 2023).*

* cited by examiner

*Primary Examiner* — Van T Trieu
(74) *Attorney, Agent, or Firm* — CANTOR COLBURN LLP

(57) ABSTRACT

Methods and systems for asset tagging bedding components and accessories in a sleep environment or manufacturing environment.

19 Claims, 1 Drawing Sheet

METHODS AND SYSTEMS FOR ASSET TAGGING BEDDING COMPONENTS AND/OR ACCESSORIES IN A DEFINED ENVIRONMENT

CROSS REFERENCE TO RELATED APPLICATIONS

This application claims the benefit of U.S. Patent Application Ser. No. 63/167,906 filed on Mar. 30, 2021, incorporated herein b y reference in its entirety.

BACKGROUND

The present disclosure generally relates to bedding component environments. More particularly, the present disclosure relates to methods and systems for asset tagging bedding components and/or accessories in a defined environment such as a home, hotel, retail setting, production facility, or the like.

Sleeping environments generally include bedding components such as mattresses, sheets, comforters and the like and various accessories including, but not limited to, lighting, alarm clocks, curtains, flooring, and the like, which are typically purchased in a retail environment with a fair expectation of performance of the particular component purchased by the user in its intended environment. Most of these products are offered and purchased one at a time and integrated into the existing sleeping environment. It's often unclear to the retail seller or the manufacturer what other components are existing in the sleep environment. Moreover, there is minimal to no feedback information provided to the retail seller or manufacturer whether the use expectations in the retail environment match the actual use in the home sleep environment or the configuration of the various components within the home sleep environment. Still further, the retail seller or manufacturer generally has no information as to the configuration of the various bedding components and accessories and whether the particular configuration or component or accessory is ideally suited to maximize the sleep experience in the sleeping environment.

BRIEF SUMMARY

Disclosed herein are methods and systems for asset tagging bedding components and accessories in a defined environment. In one or more embodiments, a system for asset tagging bedding components and/or accessories in a sleep or production environment includes at least one or more asset tags affixed to one or more bedding components and/or accessories within the sleep or production environment; a networked identification system configured with tag readers specific to the asset tag to read and locate the at least one or more asset tags; an administration module including a computer in signal communication with the tag readers over a network; and a software module that localizes the tags based on information from the tag reader.

In one or more embodiments, a method for identifying and determining location of bedding components and/or accessories within a defined environment includes affixing a unique asset tag to a bedding component; interrogating the defined environment for the unique asset tag by moving a tag reader through the defined environment; determining location of the bedding component associated with the unique asset tag in relation to other tagged bedding components; identifying the bedding component via information associated with the unique asset tag; and storing the location to a database.

The disclosure may be understood more readily by reference to the following detailed description of the various features of the disclosure and the examples included therein.

BRIEF DESCRIPTION OF DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

DETAILED DESCRIPTION

Figure 1:
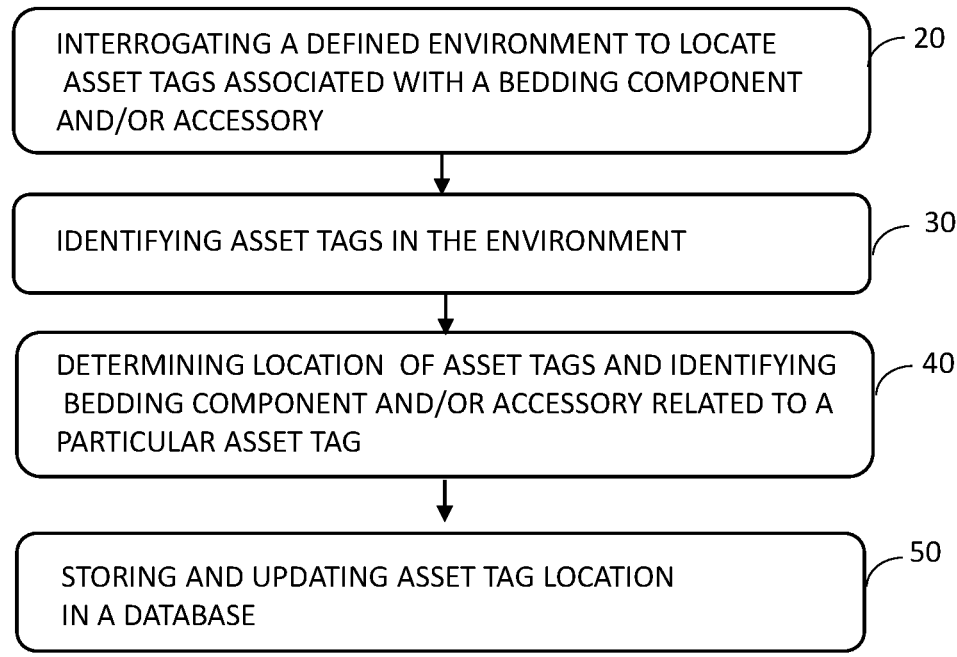
FIG. 1 is a flow diagram of a method for identifying and determining location of bedding components and/or accessories within a defined environment in accordance with one or more embodiments of the present disclosure.

Disclosed herein are methods and systems for asset tagging bedding components and/or accessories in a sleep, retail, or production environment, e.g., home, hotel, a manufacturing facility, or the like. The methods and systems generally include providing tags on a bedding component and/or accessory within the sleep or production environment. Exemplary tags include wireless tags based on radio frequency identification (RFID), near field communication (NFC), bluetooth low energy (BLE), or the like.

RFID tags use electromagnetic fields to automatically identify and track tags attached to objects. An RFID system generally includes a radio transponder, a radio receiver and transmitter. When triggered by an electromagnetic interrogation pulse from a nearby RFID reader device, the tag transmits digital data, usually an identifying inventory number, back to the reader. This number can be used to track the bedding components and/or accessories. The two types of RFID tags include passive tags that are powered by energy from the RFID reader's interrogating radio waves; and active tags that are powered by a battery and thus can be read at a greater range from the RFID reader, up to hundreds of meters. Unlike a barcode, the tag does not need to be within the line of sight of the reader, so it may be embedded in the tracked bedding component or accessory. RFID is one method of automatic identification and data capture (AIDC).

NFC tags are passive non-powered devices. NFC tags draw power from the device that reads them because of magnetic induction. When a reader gets close enough to a tag, it energizes it and transfer data from that tag.

BLE is a wireless personal area network technology designed to provide reduced power consumption and cost as compared with classic bluetooth even while maintaining a similar communication range. BLE tags are battery powered.

The systems for asset tagging bedding components and/or accessories in a sleep or production environment generally include at least one or more asset tags affixed to one or more bedding components and/or accessories within the sleep, retail, or production environments; a networked identification system configured with tag readers (i.e., interrogators) specific to the particular asset tag, e.g., interrogators capable of reading RFID, NFC, BLE or the like, wherein the network identification system reads and locates the at least one or more asset tags within the particular environment. A computer is in signal communication with the tag readers over a network, and includes a software module for storage on and operation by the computers that localizes the tags based on information from the tag reader. The system provides the capability of locating and identifying the various components used in the sleep environment regardless of when the component was introduced or replaced within the environment. Moreover, the asset tags can be configured to locate and identify the particular bedding component or accessory even when utilized in combination with different components or accessories, which can provide valuable information to the manufacturer as to the combination of bedding components or accessories that are utilized in the sleep or retail environments.

The tags are typically very small, and may be placed on a variety of items including, mattresses, box springs, sheets, comforters, head and/or foot boards, bed frame, pillows, light fixtures, radios, alarm clocks, non-bedding furniture within the sleep environment equipment, or even people, e.g., cleaning staff or the like, for example, and identification of such items may be made through a reader. Accordingly, the asset tag bedding component and/or accessory systems and methods of use may be used to track individual components and accessories in the sleep, retail or production environment, track the location relative to one another within the sleep, retail or production environment, track the use of each bedding component and/or accessory within the sleep or retail environments, and/or the like.

According to one aspect shown in FIG. 1, an asset tagging method 10 for identifying and determining location of bedding components and/or accessories within a defined environment such as in a home or hotel, a retail store, or a manufacturing facility generally includes first providing bedding component or accessory information in the asset tag and affixing the asset tag to the bedding component or accessory. The method for determining location of the tagged bedding components and/or accessories includes interrogating a defined environment by moving at least one reader through the environment to locate any asset tags associated with particular bedding components and/or accessories distributed throughout the defined environment as shown in block 20. The interrogator is configured to wirelessly detect and identify the asset tags while moving through the environment (or manufacturing facility) as shown in block 30. In block 40, once the asset tags are identified, the method includes determining a location of the tagged bedding component or accessory, which can be in relation to other tagged bedding components or accessories, which can also include identifying the particular tagged bedding component and/or accessories based on information programmed onto the asset tag, e.g., lot number, manufacturing date, identification of bedding component or accessory, e.g., mattress, sheet, pillow, material, and the like. The location information can be stored and uploaded to a database accessible by the manufacturer as shown in block 50.

Figure 2:
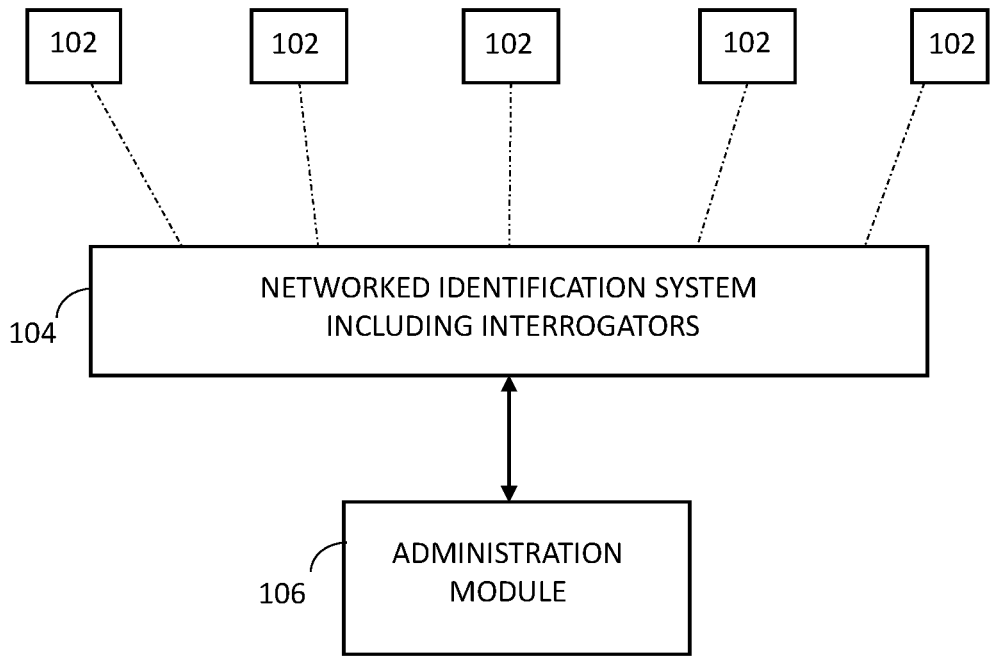
FIG. 2 is an asset tagging system in accordance with one or more embodiments of the present disclosure.

Turning now to FIG. 2, there is an asset tagging system 100 configured for use with bedding components and/or bedding accessories in a sleep environment, retail environment and/or a production environment. The asset tagging system 100 includes one or more asset tags 102, wherein a unique asset tag is attached to a selected one of bedding components and/or bedding accessories. The unique asset tag includes asset tagging data specific to the particular bedding component and/or bedding accessory. The asset tagging data can include identification information of the asset, date of manufacturing, location of manufacturing, release date, lot numbers, brand name, and/or the like. The particular asset tagging data is not intended to be limited and provides the system with real-time means to readily locate and identify a particular bedding component and/or bedding accessory by itself or as it relates to other asset tags.

The asset tagging system 100 further includes a networked identification system 104 configured with tag readers (i.e., interrogators) configured to read and locate the at least one or more asset tags 102 within the environment. An administration module 106 is provided to communicate with the networked identification system 104 and generally includes hardware, software, and/or any combination of hardware and software. The administration module includes a database is configured to provide data entry so as to provide the asset tag with asset tagging data prior and/or subsequent to attachment to a bedding component or bedding accessory.

In one or more embodiments, the reader can be integrated into a device such as with a vacuum or a replenishment cart, that may be used at a desired frequency in the sleep environment, retail environment, or manufacturing facility. Alternatively, the reader can be a hand-held device. In this manner, there is provided some degree of assurance that the entirety of the defined region is traversed at the desired frequency.

The systems and methods asset tagging bedding components and/or accessories in a sleep or production environment can be used as a learning tool for the manufacturer or retailer to determine actual use and location of the component and/or accessory, e.g., orientation of the different components within the sleep environment, which products are being used, how often cleaning occurs, how often mattress rotation occurs, how long/often a set of linen remains on the bed before its washed or swapped out for another set of linen, how often linen is washed and at what temperature or spin cycle, seasonal information on types of bedding components being used, or the like. In this manner, a feedback loop can be provided to the retailer and/or manufacturer that helps inform how the various components and/or accessories are designed and marketed. For example, the bedding components and/or accessories can be tracked through the consumption chain. From this, the manufacturer as well as the retailer can better and more accurately understand real time inventory within the manufacturing plant and retail stores; understand real time status of products that are in transit; understand what products are picked up, how long they are picked up and whether they are purchased; and better understand how long consumers may interact with a bedding component and/or accessory in a retail setting.

Additionally, the manufacturer can utilize asset tagging during a production cycle to ensure quality and reproducibility of materials. For example, foam manufacturers typically utilize manual processing and the end product is reliant on operators to detail product history with accurate information that is important to quality for the foam product. By way of example, foam curing and glue curing times are critical to final quality. The foam or components being glued could be asset tagged to insure a minimal defined amount of time passes to allow sufficient curing to meet a quality standard. Asset tagging could be used to create a process gate that would not allow an operator to proceed to the next step until the minimal defined curing time has been met. Asset tagging will solve the problem associated with the process being manual with potential that the minimal defined curing time can be readily overridden. In another example, because many of the processes related to building a mattress are manual, asset tagging of the bedding components can provide a window into a supplier's manufacturing process, provide real time tracking of work in progress (WIP) through process, provide real time tracking of inventory (eliminating manual reporting that is subject to error), and the like. With regard to mattress fulfillment, asset tagging of the bedding components can provide real time tracking of mattress through fulfillment process, reduce fulfillment errors (staged, then lost), reduce supply chain team bandwidth manually tracking staged, then lost shipments, provide real time view of mattress production process stage for customers, and the like. In terms of product quality, asset tagging provides an opportunity tie back all relevant process parameters for each component to each individual mattress. Similarly, asset tagging can help prevent fraud by tracking stolen mattresses or mattresses that have been donated from being returned. Other examples include the ability to track down particular bedding components and/or accessories in the event of a recall, for example. Instead of the traditional recall based on lot identification, the use of the system provides the ability to identify specific products that may be at issue for recall.

In addition, the systems and methods for asset tagging bedding components and/or accessories can be configured to provide the retailer and/or manufacturer with information regarding end of life of a product so that contact can be made with the consumer or retailer prior to expiration. For example, proactive contact can be made to the consumer of a pillow or mattress when it begins to lose form due to wear/tear or age. Likewise, the retailer and/or manufacturer can proactively take action on warranty claims before the consumer is even aware there is a problem. Moreover, based on product selection, discounts can be offered to the consumer on upgraded versions, which can occur prior to a mass public offering. The systems and methods for asset tagging bedding component and/or accessories can be used to better track shipments and returns providing additional interaction with the consumer before the product arrives as well as subsequent to the product being returned or disposed. In addition, the systems and methods provide for real time inventory in the stores, real time status of products in transit, an increased understanding in what products are picked up, for how long and if they are purchased while on the shelf in retail, and/or an increased understanding on consumer selection of a bedding product within the retail setting, e.g., the systems and method can be configured to track how long a person lays on our mattresses in retail or interacts with a product.

In other examples, asset tagging can be configured for quality control. Lot numbers of bedding components can be attached to a finished good. In this manner, if there is a recall for whatever reason, the recall can be specific to a group of products instead of recalling based on date parameters, for example. The asset tag can be used to provide a quality code, which can be used, for example, to provide the consumer with an estimate of the remaining warranty or end of life cycle. Moreover, the quality code could be configured to be content driven such that the consumer can be made aware of various accessories and/or available upgrades. Still further, the asset tag can be used to provide information on instructions, care, disposal methods, and the like.

Other capabilities as it relates to bedding components and bedding accessories, is that the asset tag can be utilized for environmental sensing including, but not limited to, temperature, humidity, position in the room, and direction; use sensing such as providing information related to length of usage, occupancy, when product is removed from environment (seasonal or for washing), number of washes, temp of wash and cycle, usage with other products (i.e. sheets+bed, duvet+sheets, pillow+bed, nightstand+bed, etc.); and/or product build sensing including providing information related to indention force deflection (IFD), compression, off gassing, firmness rating, degradation, wear, and the like; standard sensing such as supply chain, manufacturing, shipping/delivery/disposal.

The network identification system 104 can include a network interface such as a mobile application and backend cloud. The mobile application is the ideal "hub" to capture and transmit asset tag data back to our cloud. The application would link the product to the user for warranty and service purposes as well as to the user's profile. Product data would inform us about the user's needs, usage and using cloud-based machine learning, make recommendations to the user on other products, services or tips. The data would also create a feedback loop to every function in the consumption chain including the product team, supply chain, logistics, finance, marketing, engineering and customer service. Each group would use this data to better service the customer with products/services specific to their functional groups. As we introduce other smart devices into sleep or manufacturing environment, these connected devices could act as the hub. These would function in the same manner as the mobile application described above as a hub and include any product that is powered and capable of transmitting data packages via BLE/Wifi/Cellular/Zwave/Zigbee protocols. Examples of these product hubs would be smart mattresses, smart lights, powered furniture, powered nightstands, powered pillows.

The administration module 106 generally includes a networked computer including a processing unit, a system memory and a system bus. The system bus couples system components including, but not limited to, the system memory to the processing unit. The processing unit can be any of various commercially available processors. Dual microprocessors and other multi-processor architectures may also be employed as the processing unit. The computer further includes an internal hard disk drive (HDD) (e.g., EIDE, SATA), which internal hard disk drive may also be configured for external use in a suitable chassis (not shown), a magnetic floppy disk drive (FDD), (e.g., to read from or write to a removable diskette) and an optical disk drive, (e.g., reading a CD-ROM disk or, to read from or write to other high capacity optical media such as the DVD). The hard disk drive, magnetic disk drive and optical disk drive can be connected to the system bus by a hard disk drive interface, a magnetic disk drive interface and an optical drive interface, respectively. The interface for external drive implementations includes at least one or both of Universal Serial Bus (USB) and IEEE 1394 interface technologies. Other external drive connection technologies are within contemplation of the subject invention.

The drives and their associated computer-readable media provide nonvolatile storage of data, data structures, computer-executable instructions, and so forth. For the computer, the drives and media accommodate the storage of any data in a suitable digital format. Although the description of computer-readable media above refers to HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the invention.

A number of software program modules can be stored in the drives and RAM, including an operating system, one or more application programs, other program modules and program data. All or portions of the operating system, applications, modules, and/or data can also be cached in the RAM. It is appreciated that the invention can be implemented with various commercially available operating systems or combinations of operating systems.

A user can enter commands and information into the computer through one or more wired/wireless input devices, e.g., a keyboard and a pointing device, such as a mouse. Other input devices (not shown) may include a microphone, an IR remote control, a joystick, a game pad, a stylus pen, touch screen, or the like. These and other input devices are often connected to the processing unit through an input device interface that is coupled to the system bus, but can be connected by other interfaces, such as a parallel port, an IEEE 1394 serial port, a game port, a USB port, an IR interface, etc.

A monitor or other type of display device can also be connected to the system bus via an interface, such as a video adapter. In addition to the monitor, a computer typically includes other peripheral output devices (not shown), such as speakers, printers, etc.

The computer is operable to communicate with any wireless device or entity operatively disposed in wireless communication via wireless communication port. In one embodiment, the computer communicates with the reader using any well-known or envisioned wireless communication technology, including; for example, Wi-Fi and Bluetooth™ wireless technologies.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for asset tagging bedding components and/or bedding accessories in a sleep or bedding production environment comprising:
    at least one or more asset tags affixed to a selected one or more bedding components and/or bedding accessories within the sleep or the bedding production environment, wherein the asset tag as it relates to each of the affixed bedding components and/or bedding accessories comprises identification information, date of manufacturing, location of manufacturing, release date, lot numbers, brand name or combinations comprising at least one of the foregoing;
    a networked identification system configured with tag readers specific to the asset tag to read and locate the at least one or more asset tags used in the sleep environment or the bedding production environment;
    an administration module comprising a computer in signal communication with the tag readers over a network; and
    a software module that locates the asset tags based on information from the tag reader.

2. The system of claim 1, wherein the tag readers are integrated into a movable appliance utilized within the sleep environment and/or the bedding production environment.

3. The system of claim 1, wherein the movable appliance comprises a vacuum cleaner or a cart within the sleep environment and/or the bedding production environment.

4. The system of claim 1, wherein the tag readers comprise a handheld device.

5. The system of claim 1, wherein the one or more asset tags comprise radiofrequency identification (RFID), near-field communication (NFC), or bluetooth low energy (BLE) tags.

6. The system of claim 1, wherein the network identification system comprises a network interface configured to capture and transmit asset tag data back to a cloud.

7. The system of claim 6, wherein the network interface links the tagged bedding component or bedding accessory to a user for warranty and service purposes.

8. The system of claim 6, wherein the data is configured to provide a feedback loop to every function in a consumption chain.

9. The system of claim 1, wherein the asset tag data is configured to provide a process gate for manufacturing a bedding component.

10. The system of claim 1, wherein the asset tag is configured to provide a quality code to provide a consumer with an estimate of remaining warranty or end of life cycle.

11. A method for identifying and determining location of bedding components and/or accessories within a defined environment, the method comprising:
    affixing a unique asset tag to a bedding component, wherein the asset tag as it relates to each of the affixed bedding components comprises identification information, date of manufacturing information, location of manufacturing information, release date information, lot numbers information, brand name information or combinations comprising at least one of the foregoing;
    interrogating the defined environment for the unique asset tag by moving a tag reader through the defined environment;
    determining location of the bedding component associated with the unique asset tag in relation to other tagged bedding components;
    identifying the bedding component via the information associated with the unique asset tag; and
    storing the location to a database.

12. The method of claim 11, wherein the information associated with the unique asset tag comprises product name, lot number, date of manufacture, material type, manufacturing process parameters, and combinations thereof.

13. The method of claim 11, wherein the unique asset tag is configured to provide environmental sensing, use sensing and/or product build sensing.

14. The method of claim 13, wherein the environmental sensing comprises recording temperature, humidity, and/or bedding component position in the defined environment.

15. The method of claim 13, wherein the use sensing comprises recording information related to length of usage, occupancy, when product is removed from environment (seasonal or for washing), number of washes, temp of wash and cycle, usage with other products, or combinations thereof.

16. The method of claim 13, wherein the product build sensing comprises recording information related to indention force deflection (IFD), compression, off gassing, firmness rating, degradation, wear, or combinations thereof.

17. The system of claim 1, wherein the asset tag is configured to provide environmental sensing comprising temperature, humidity, position in the room, direction or combinations thereof.

18. The system of claim 1, wherein the asset tag is configured to provide use sensing comprising length of usage information, occupancy information, information on when product is removed from environment, number of washes information, temperature of wash and cycle information, information about usage with other products, or combinations thereof.

19. The system of claim 1, wherein the asset tag is configured to provide product build sensing comprising information related to indention force deflection (IFD), compression, off gassing, firmness rating, degradation, wear, or combinations thereof.

* * * * *